(12) United States Patent
Weinraub et al.

(10) Patent No.: US 7,777,514 B2
(45) Date of Patent: Aug. 17, 2010

(54) METHODS FOR TRANSFERRING INTEGRATED CIRCUITS TO A PRINTED CIRCUIT BOARD

(75) Inventors: Chananiel Weinraub, Herzelia (IL); Einam Amotz, Jerusalem (IL)

(73) Assignee: Texas Instruments Incorporated, Dallas, TX (US)

( * ) Notice: Subject to any disclaimer, the term of this patent is extended or adjusted under 35 U.S.C. 154(b) by 202 days.

(21) Appl. No.: 11/969,810

(22) Filed: Jan. 4, 2008

(65) Prior Publication Data
US 2009/0174427 A1 Jul. 9, 2009

(51) Int. Cl.
*G01R 31/26* (2006.01)
(52) U.S. Cl. .................... 324/765; 324/158.1
(58) Field of Classification Search ............... None
See application file for complete search history.

(56) References Cited

U.S. PATENT DOCUMENTS 5,701,666 A * 12/1997 DeHaven et al. ............ 29/831
6,215,321 B1 * 4/2001 Nakata ...................... 324/754
6,394,820 B1 5/2002 Palaniappa et al. ........... 439/83
6,533,589 B1 3/2003 Palaniappa et al. ........... 439/71

OTHER PUBLICATIONS

GHz BGA Socket User Manual, Ironwood Electronics, Mar. 6, 2007.

* cited by examiner

*Primary Examiner*—Vinh P Nguyen
(74) *Attorney, Agent, or Firm*—Yingsheng Tung; Wade J. Brady, III; Frederick J. Telecky, Jr.

(57) ABSTRACT

The present invention implements a mechanism using an inter-connection layer to couple a plurality of integrated circuit devices to a printed circuit board, thereby eliminating the need for sockets to hold the integrated circuit devices on the printed circuit board. The mechanism of the present invention is operative for integrated circuit devices packaged in a ball grid array, a quad flat pack or a leadless quad flat pack. The present invention also provides a mechanism to efficiently transfer a plurality of integrated circuit devices from an integrated circuit device delivery tray to a burn-in board in a single process without requiring an autoloader, resulting in increased transfer reliability and both cost and space savings.

14 Claims, 8 Drawing Sheets

METHODS FOR TRANSFERRING INTEGRATED CIRCUITS TO A PRINTED CIRCUIT BOARD

FIELD OF THE INVENTION

The present invention relates to the field of burn-in-board design architecture and more particularly relates to a more efficient method of burn-in-board design which enables a more efficient transfer of a plurality of integrated circuit devices from an integrated circuit device delivery tray to a burn-in board.

BACKGROUND OF THE INVENTION

During the integrated circuit (IC) device manufacturing process, a specific percentage of IC devices are subject to a series of testing phases after the silicon dies are attached and electrically to printed circuit boards, thereby creating the IC devices. One of the final testing phases is burn-in, during which the internal core logic of the IC devices are exposed to heat and simultaneously activated with voltage levels that are significantly greater than design specifications. Burn-in typically last several hours at temperatures reaching 140° C. and voltage levels that are typically 40% higher than the IC device design specification, which usually has a tolerance of plus or minus five to ten percent.

Burn-in is performed in specially designed burn-in ovens that hold a plurality of printed circuit boards (PCBs) known as burn-in boards (BIBs), with each BIB holding a plurality of IC devices (typically 40 to 50) mounted in its own socket. Prior to installation, IC devices, also known as devices under test (DUTs) arrive from a fabrication plant in IC device delivery trays which typically hold more than 60 DUTs. An angled view of a section of a sample IC device delivery tray is shown in FIG. 1A. The IC device delivery tray, generally referenced 10, comprises IC device delivery tray section 12 and twenty one cavities 14. The cavities are recessed to hold the DUTs in place.

DUTs are positioned in the cavities of the IC device delivery tray with their contacts facing down (i.e. into the tray). A sample IC device is shown in FIG. 1B. The diagram, generally referenced 20, comprises IC device 22 with contacts 24.

Prior to burn-in DUTs transferred from an IC device delivery tray to a BIB via an autoloader. An autoloader is an electro-mechanical pick-and-place machine which removes an individual DUT from an IC device delivery tray and couples it to an available socket on the BIB. A block diagram illustrating an autoloader is shown in FIG. 2. The block diagram, generally referenced 30, comprises IC device delivery tray 32, autoloader 42 and BIB 44. DUTs 34, 36, 38, 40 arrive in IC device delivery tray 32 with their interface contacts resting on the IC device delivery tray (i.e. facing down). Autoloader 42 takes hold of the DUTs individually and installs them into sockets 46, 48, 50, 52 coupled to BIB 44.

There are inherent inefficiencies with transferring DUTs from an IC device delivery tray to a BIB. Since the autoloader transfers DUTs individually and the capacity of each BIB can be more than 50 DUTs, this is a lengthy process. In addition, the number of DUTs on an IC device delivery tray is generally greater than the number of DUTs to be installed on each BIB. Therefore more BIBs than Trays are required, which increases BIB production cost.

There are also inefficiencies with designing BIBs with sockets to hold the DUTs. The overhead of sockets in BIB designs impacts the size of the BIB and the size of the burn-in oven (each oven holds multiple BIBs). In addition, sockets are expensive, can only be used for a specific DUT design and have a limited lifespan.

Therefore, there is a need for a mechanism to transfer a plurality of DUTs from an IC device delivery tray to a BIB in a single step. For efficiency, the number of DUTs on the BIB should equal the number of DUTs in the IC device delivery tray. In addition, the BIB should be designed without using sockets. This reduces the cost and the size of the BIBs. Smaller BIBs enable the design of smaller burn-in ovens which further reduces costs due to smaller size, higher capacity and lower energy requirements per tested IC device.

SUMMARY OF THE INVENTION

The present invention provides a solution to the prior art problems discussed supra by using an inter-connection layer to couple a plurality of integrated circuit (IC) devices to a burn-in board (BIB), a specific type of printed circuit board used during the burn-in process. The inter-connection layer is comprised of electrical conducting material embedded in a sheet of insulating elastomer (a non-conducting material). When pressure is applied to the inter-connection layer, the embedded electrical conducting material within the inter-connection layer couple to the IC device contacts on one side of the inter-connection layer and the appropriate BIB contacts on the other side of the inter-connection layer. The mechanism of the present invention is operative for IC devices packaged in a ball grid array (BGA) whose electrical interface contacts comprise balls of solder coupled to the bottom of the packaging, a quad flat pack (QFP) whose electrical interface contacts comprise pins extending from each of the four sides of the packaging or a quad flat leadless pack (QFN), whose electrical interface contacts comprise of pads coupled to the bottom of the packaging.

The present invention also provides a mechanism to efficiently transfer a plurality of IC devices from an IC device delivery tray to a BIB in a single process without using an autoloader as required by the prior art. Eliminating the need for an autoloader results in hardware cost, time and space savings. Transferring all the IC devices from an IC device delivery tray directly to a BIB in a single process reduces the physical handling of the IC devices, and therefore reduces the chance of any potential handling errors.

The present invention is operative to facilitate the design of BIBs that do not require sockets to hold the IC devices. The absence of sockets facilitates the design of BIBs that are at the same time smaller and hold a greater number of IC devices. The absence of sockets on the BIB, smaller BIB size and increased BIB capacity significantly reduces the cost of manufacturing BIBs. In addition the transferring mechanism of the present invention enables the design of BIBs that hold the same number of IC devices that arrive in the IC device delivery tray. This one to one relationship of IC devices in the IC device delivery tray to IC devices on the BIB adds efficiency to the transfer mechanism of the present invention that was not possible in the prior art.

Smaller BIBs with greater capacity also enables the design of smaller burn-in ovens that hold a greater number of trays and therefore a greater number of IC devices. This results in cost savings in burn-in oven production (due to smaller size), reduced space requirements and reduced energy requirements.

There is thus provided in accordance with the invention, a method of coupling a plurality of integrated circuit (IC) devices having a plurality of contacts to a printed circuit board, the method comprising the steps of sandwiching an inter-connection layer between the IC devices and the printed circuit board and applying opposing pressure to the IC devices and the printed circuit board, thereby making electrical contact between the plurality of contacts on the IC device and corresponding contacts on the printed circuit board.

There is also provided in accordance with the invention, an apparatus for coupling a plurality of integrated circuit (IC) devices having a plurality of contacts to a printed circuit board comprising a carrier tray for holding the IC devices, an inter-connection layer and a printed circuit board, wherein opposing pressure to the carrier tray and the printed circuit board causes electrical contact between the plurality of contacts on the plurality of IC devices and the printed circuit board.

There is further provided in accordance with the invention, a method of transferring a plurality of integrated circuit (IC) devices having a plurality of contacts from an IC device delivery tray holding a plurality of the IC devices to a printed circuit board, the method comprising the steps of placing a carrier tray over the IC device delivery tray, removing the IC device delivery tray, placing an inter-connection layer over the carrier tray containing the IC devices, placing the printed circuit board on top of the inter-connection layer and applying opposing pressure to the carrier tray and the printed circuit board, thereby making electrical contact between the plurality of contacts on the IC device and corresponding contacts on the printed circuit board.

There is also provided in accordance with the invention, an apparatus for transferring a plurality of integrated circuit (IC) devices having a plurality of contacts from an IC delivery tray holding a plurality of the IC devices to a printed circuit board comprising a carrier tray for holding the IC devices, an inter-connection layer, a printed circuit board; and a carrier pressure support tray, wherein opposing pressure to the carrier tray and the printed circuit board causes electrical contact between the plurality of contacts on the plurality of IC devices and the printed circuit board.

There is further provided in accordance with the invention, a method of transferring a plurality of integrated circuit (IC) devices having a plurality of contacts from an IC device delivery tray holding a plurality of the IC devices to a burn-in board for testing the plurality of IC devices, the method comprising the steps of placing a carrier tray over the IC device delivery tray, removing the IC device delivery tray, placing an inter-connection layer over the carrier tray containing the IC devices, placing the burn-in board on top of the inter-connection layer and applying opposing pressure to the carrier tray and the burn-in board, thereby making electrical contact between the plurality of contacts on the IC device and corresponding contacts on the burn-in board.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1A:
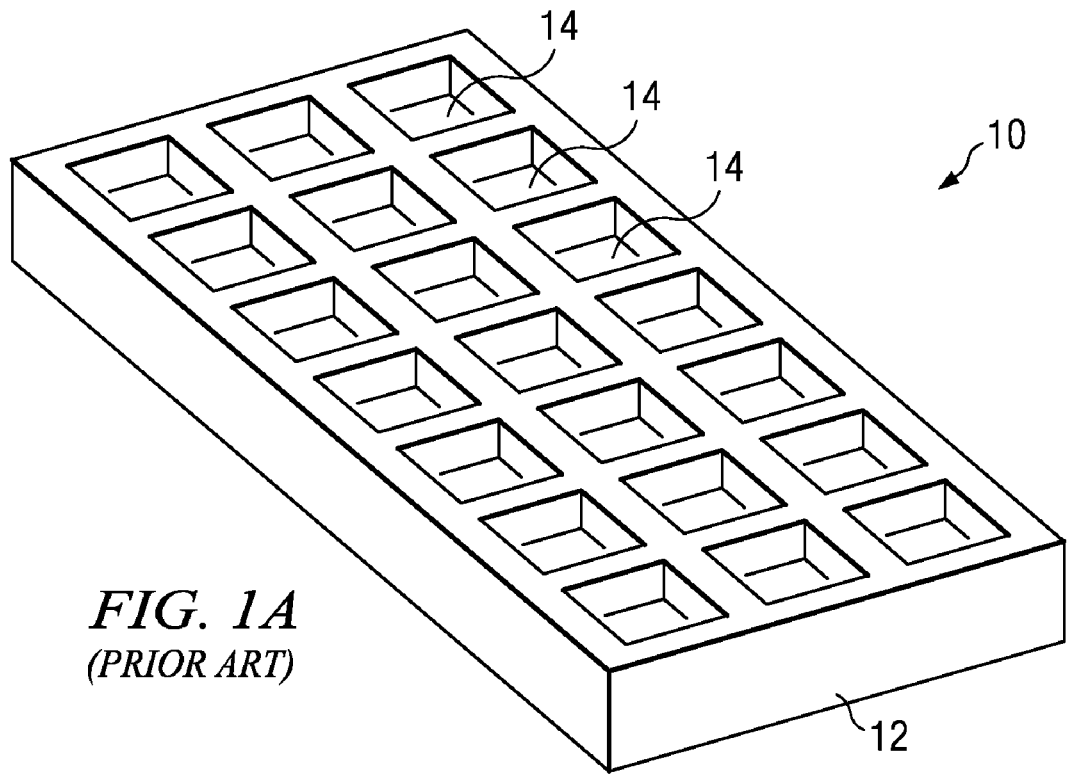
FIG. 1A is an angled view of an integrated circuit delivery tray illustrating the prior art.
Figure 1B:
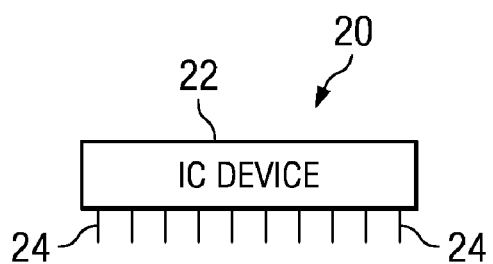
FIG. 1B is a diagram of an integrated circuit device illustrating the prior art.
Figure 2:
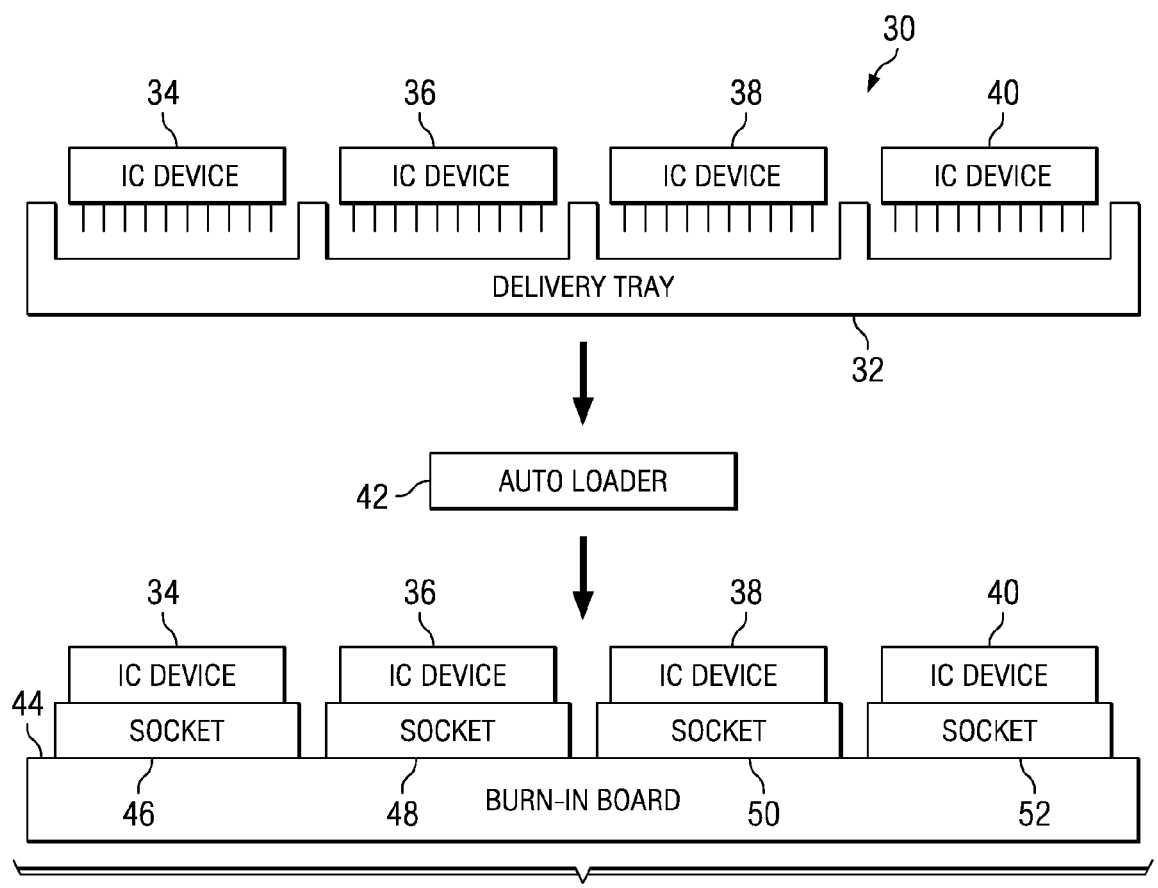
FIG. 2 is a block diagram illustrating the integrated circuit device transfer process of the prior art utilizing an autoloader.

The following notation is used throughout this document.

| Term | Definition |
| --- | --- |
| BGA | Ball Grid Array |
| BIB | Burn-In Board |
| DUT | Device Under Test |
| IC | Integrated Circuit |
| PCB | Printed Circuit Board |
| QFN | Quad Flat Leadless Pack |
| QFP | Quad Flat Pack |

Detailed Description of the Invention

The present invention provides a solution to the prior art problems discussed supra by using an inter-connection layer to couple a plurality of integrated circuit (IC) devices to a burn-in board (BIB), a specific type of printed circuit board used during the burn-in process. The inter-connection layer is comprised of electrical conducting material embedded in a sheet of insulating elastomer (a non-conducting material). When pressure is applied to the inter-connection layer, the embedded electrical conducting material within the inter-connection layer couple to the IC device contacts on one side of the inter-connection layer and the appropriate BIB contacts on the other side of the inter-connection layer. The mechanism of the present invention is operative for IC devices packaged in a ball grid array (BGA) whose electrical interface contacts comprise balls of solder coupled to the bottom of the packaging, a quad flat pack (QFP) whose electrical interface contacts comprise pins extending from each of the four sides of the packaging or a quad flat leadless pack (QFN) whose electrical interface contacts comprise pads coupled to the bottom of the packaging.

The present invention also provides a mechanism to efficiently transfer a plurality of IC devices from an IC device delivery tray to a BIB in a single process without using an autoloader as required by the prior art. Eliminating the need for an autoloader results in cost, time and space savings. Transferring all the IC devices from an IC device delivery tray directly to a BIB in a single process reduces the physical handling of the IC devices, and therefore reduces the chance of any potential handling errors.

The present invention is operative to facilitate the design of BIBs that do not require sockets to hold the IC devices. The absence of sockets facilitates the design of BIBs that are at the same time smaller and hold a greater number of IC devices. The absence of sockets on the BIB, smaller BIB size and increased BIB capacity significantly reduces the cost of manufacturing BIBs. In addition the transferring mechanism of the present invention enables the design of BIBs that hold the same number of IC devices that arrive in the IC device delivery tray. This one to one relationship of IC devices in the IC device delivery tray to IC devices on the BIB adds efficiency to the transfer mechanism of the present invention that was not possible in the prior art.

Smaller BIBs with greater capacity also enables the design of smaller burn-in ovens that hold a greater number of trays and therefore a greater number of IC devices. This results in cost savings in burn-in oven production (due to smaller size), reduced space requirements and reduced energy requirements.

Burn-in Board Architecture

As discussed supra, the mechanism of the present invention uses an inter-connection layer to couple integrated circuit (IC) devices to a burn-in board (BIB). Employing an inter-connection layer eliminates the need for sockets on the BIB, which reduces the cost of producing the BIB and enables the design of smaller BIBs that are able to hold a greater number of IC devices. The mechanism of the present invention enables the design of BIBs whose IC device capacity matches the number of IC devices in an IC device delivery tray. This one to one ratio of IC devices in the IC device delivery tray and IC devices on the BIB enables a more efficient transfer of IC devices from the IC device delivery tray to the BIB.

The inter-connection layer referenced by the present invention is comprised of multiple rows of electrical conducting materials embedded symmetrically in a sheet of insulating material (e.g., silicon rubber, also called elastomer). Upon applying pressure to the sheet, the ends of the conductors within the inter-connection layer penetrate the surface of the inter-connection layer, enabling coupling of the IC devices to the BIB via the inter-connection layer. Once the applied pressure to the inter-connection layer is released, the electrical conductors recede back into the inter-connection layer. Inter-connection layers are reusable and have high heat tolerances. Aside from being significantly less expensive than sockets, inter-connection layers are not specific to any IC device. Whereas testing different types of IC devices require the use of different sockets, an inter-connection layer can be used for coupling a variety of IC devices to a BIB.

Figure 3:
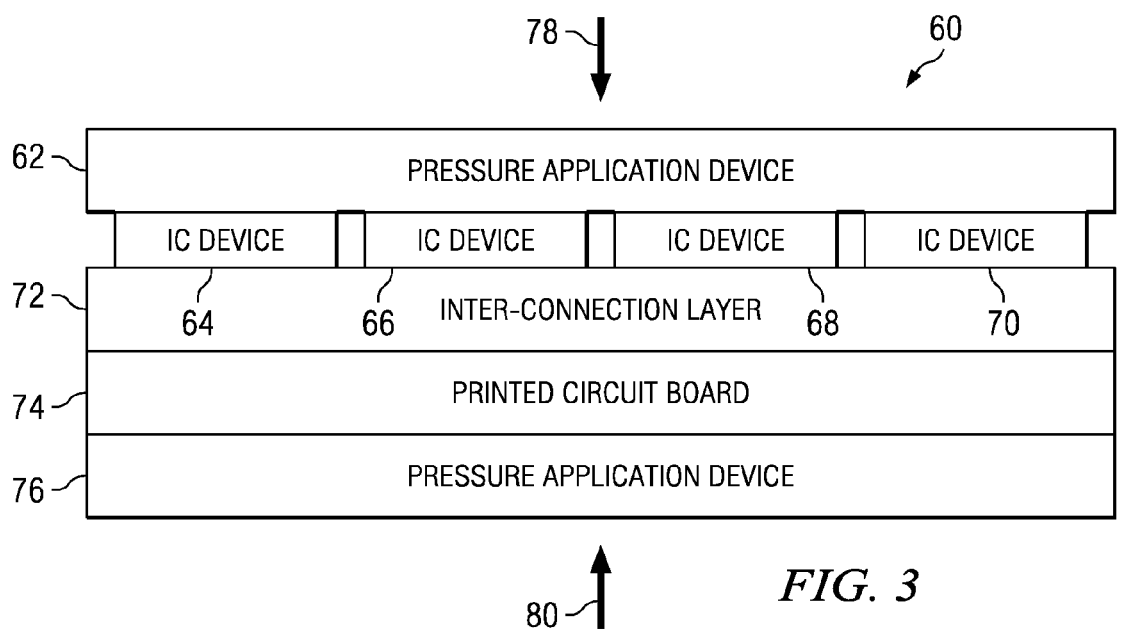
FIG. 3 is a block diagram illustrating the integrated circuit device coupling method of the present invention.

A block diagram illustrating the IC device coupling method of the present invention is shown in FIG. 3. The block diagram, generally referenced 60, comprises pressure application devices 62, 76, IC devices 64, 66, 68, 70, inter-connection layer 72, printed circuit board 74 and opposing pressure forces 78, 80 Inter-connection layer 72 is sandwiched between IC devices 64, 66, 68, 80 and printed circuit board 74. Opposing pressure 78 and 80 applied to pressure application devices 62 and 76 enables the contacts of IC devices 64, 66, 68, 70 to couple to the corresponding contacts on printed circuit board 74 via the conductors within inter-connection layer 72. Implementations of opposing forces 78, 80 include using screws or latches to coupling pressure support devices 62, 76. The resulting opposing pressure sandwiches the entire mechanism referenced by block diagram 60.

Figure 4A:
FIG. 4A is a side view of a first example of an inter-connection layer utilized by the present invention.

A side view of an inter-connection layer is shown in FIG. 4A. The inter-connection layer, generally referenced 90 comprises matrix of metal wires 92 embedded in elastomer material 94. An example inter-connection layer commercially available and suitable for use with the present invention is the Model No. SG-BGA-6007, manufactured by Ironwood Electronics, 11351 Rupp Drive, Suite 400, Burnsville, Minn. 55337, USA. In the example implementation presented herein, the wires comprise 40 micron diameter gold plated brass filaments arranged symmetrically in a 0.75 mm thick silicon layer. It is appreciated that other size diameters and may be used depending on the particular application.

Figure 4B:
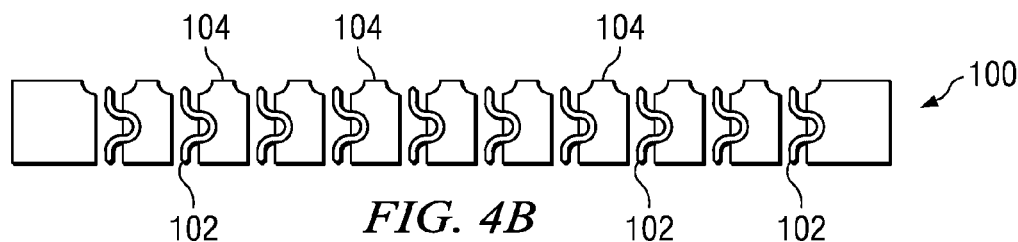
FIG. 4B is a side view of a second example of an inter-connection layer utilized by the present invention.
Figure 4C:
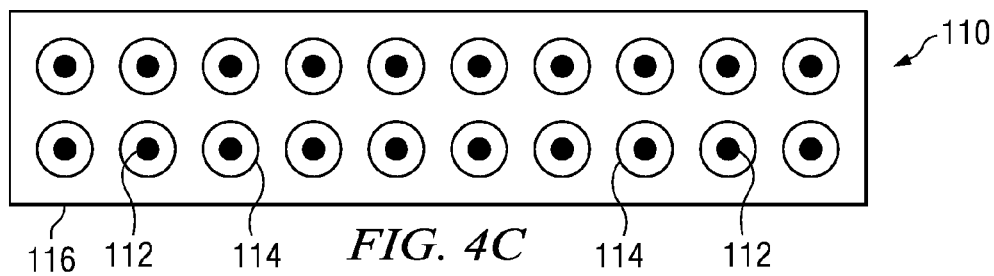
FIG. 4C is a top-down side view of the second example of an inter-connection layer utilized by the present invention.

Another implementation of an inter-connection layer is shown in FIGS. 4B and 4C. This inter-connection layer is specifically designed to accommodate IC devices packaged in a ball grid array, where the electrical interface contacts comprise balls of solder coupled to the bottom of the packaging. A side view of this implementation is shown in FIG. 4B. The interconnection layer, generally referenced 100, comprises a matrix of metal wires (in this case spring contacts) 102 embedded in non-conducting material 104. Balls of solder that comprise the electrical interface of an IC device packaged in a ball grid array couple to wires 102 via their positioning in indentations 104.

A top-down view of the inter-connection layer referenced in FIG. 4B is shown in FIG. 4C. The inter-connection layer, generally referenced 110, comprises a matrix of metal wires 112 embedded in non-conducting material 116. Balls of solder that comprise the electrical interface of an IC device packaged in a ball grid array couple to wires 112 via their positioning in indentations 114.

Figure 5:
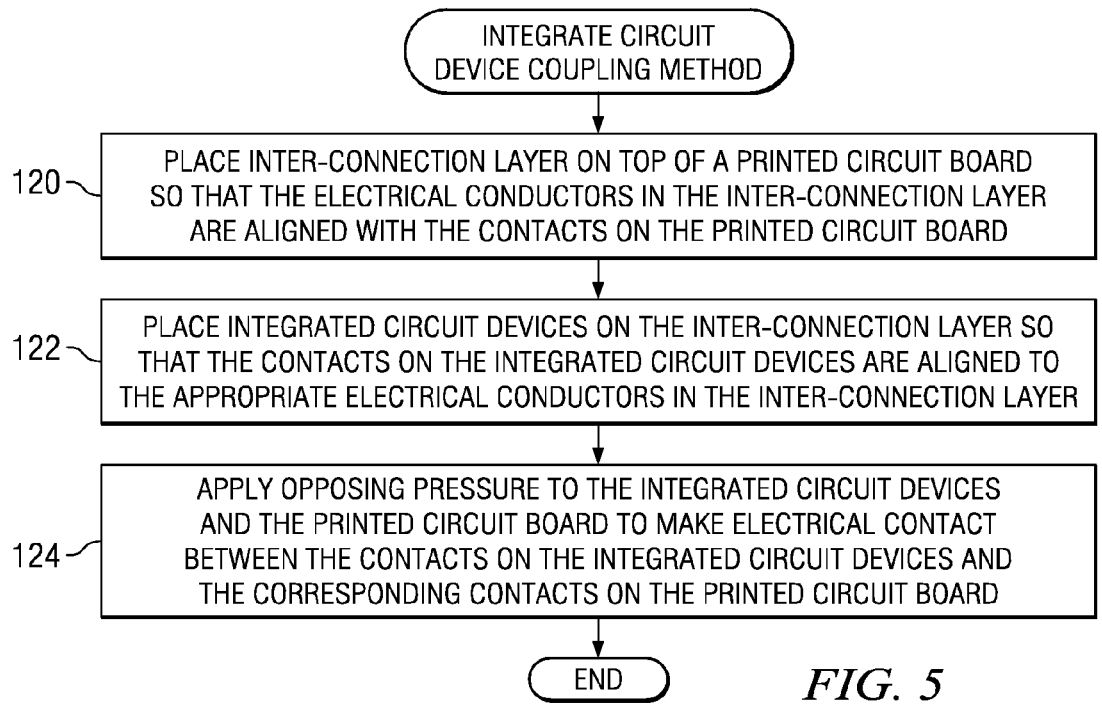
FIG. 5 is a flow diagram illustrating the integrated circuit device coupling method of the present invention.

A flow diagram illustrating the integrated circuit coupling method to a printed circuit board (i.e. BIB) of the resent invention is shown in FIG. 5. First, an inter-connection layer is placed on top of a printed circuit board so that the electrical conductors in the inter-connection layer are aligned with the contacts on the printed circuit board (step 120). IC devices are then placed on the inter-connection layer so that the contacts of the IC devices are aligned with the electrical conducting material within the inter-connection layer and the appropriate contacts on the printed circuit board (step 122). Finally opposing pressure is applied to the IC devices and the printed circuit board to enable the contacts on the IC devices to couple to their appropriate contacts on the printed circuit board via the electrical conducting material within the inter-connection layer (step 124).

Transferring Integrated Circuit Devices to a Burn-in Board

In accordance with the invention, integrated circuit (IC) devices are coupled to a burn-in board (BIB) via an inter-connection layer that eliminates the need for sockets on the BIB. As discussed supra, the transferring mechanism of the present invention enables the design of BIBs that hold the same number of IC devices that are in the IC device delivery tray. This one to one relationship of IC devices in the IC device delivery tray to IC devices on the BIB adds efficiency to the transfer mechanism of the present invention that was not possible in the prior art.

Figure 6A:
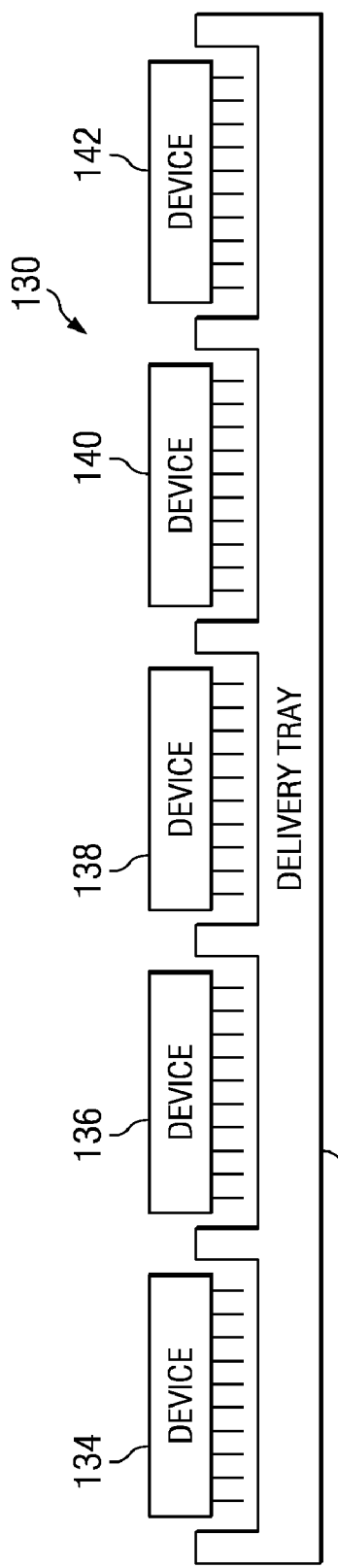
FIG. 6A is a diagram illustrating the first step of the integrated circuit device transfer and burn-in board coupling method of the present invention.
Figure 6B:
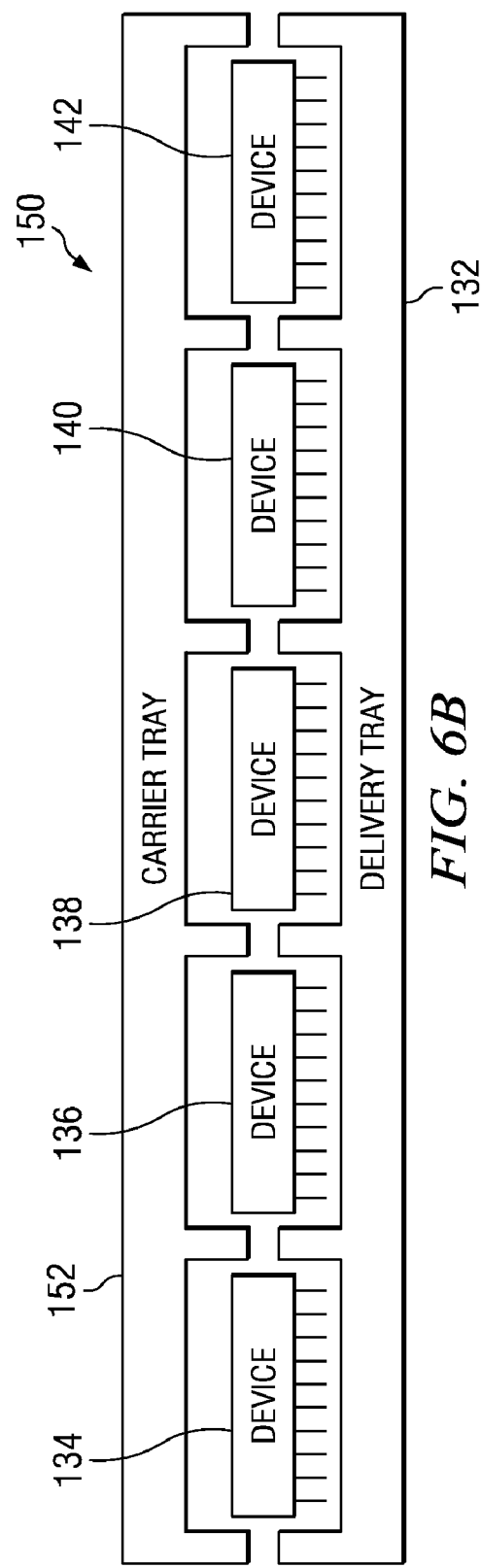
FIG. 6B is a diagram illustrating the second step of the integrated circuit device transfer and burn-in board coupling method of the present invention.

A visual representation of the transferring mechanism of the present invention is shown in FIGS. 6A, 6B, 6C, 6D, and 6E. FIG. 6A, generally referenced 130, shows IC device delivery tray 132 holding IC devices 134, 136, 138, 140 and 142, with their electrical contacts facing down into IC device delivery tray 132. In FIG. 6B, generally referenced 150, carrier tray 152 is positioned on top of IC device delivery tray 132 holding IC devices 134, 136, 138, 140 and 142 still with their electrical contacts facing IC device delivery tray 132. A preferred implementation of carrier tray 152 would have the tray fabricated from metal, which aside from making the tray stronger enables the tray to function as a heat-sink or a heat conductor.

Figure 6C:
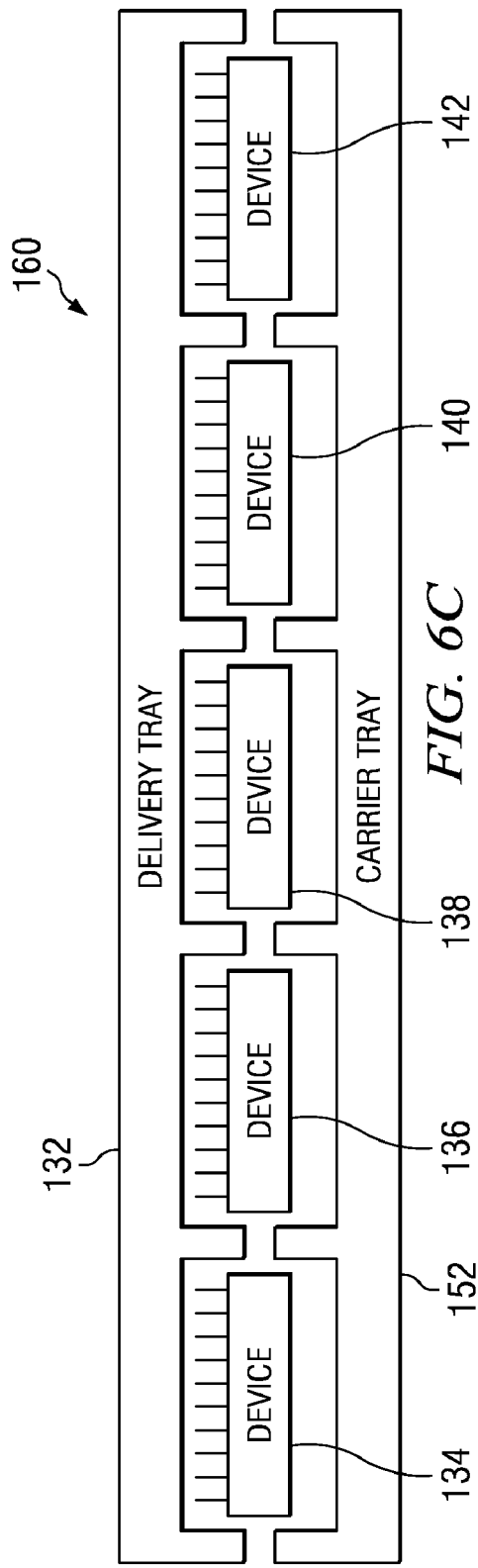
FIG. 6C is a diagram illustrating the third step of the integrated circuit device transfer and burn-in board coupling method of the present invention.
Figure 6D:
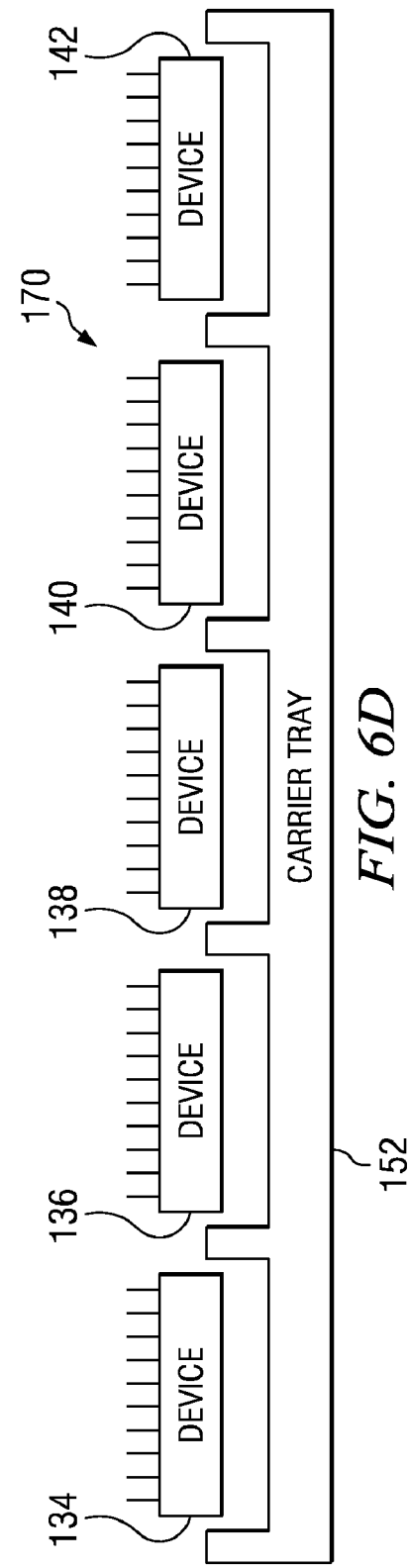
FIG. 6D is a diagram illustrating the fourth step of the integrated circuit device transfer and burn-in board coupling method of the present invention.

FIG. 6C, generally referenced 160, shows the apparatus shown in FIG. 6B flipped over. IC device delivery tray 132 is now above carrier tray 152. IC devices 134, 136, 138, 140 and 142 are now resting in carrier tray 152 with their electrical interface contacts still facing IC device delivery tray 132. FIG. 6D, generally referenced 170, shows carrier tray 152 holding IC devices 134, 136, 138, 140 and 142 when IC device delivery tray 132 of FIG. 6C is removed. The electrical contacts of IC devices 134, 136, 138, 140 and 142 are now exposed (i.e. facing up).

Figure 6E:
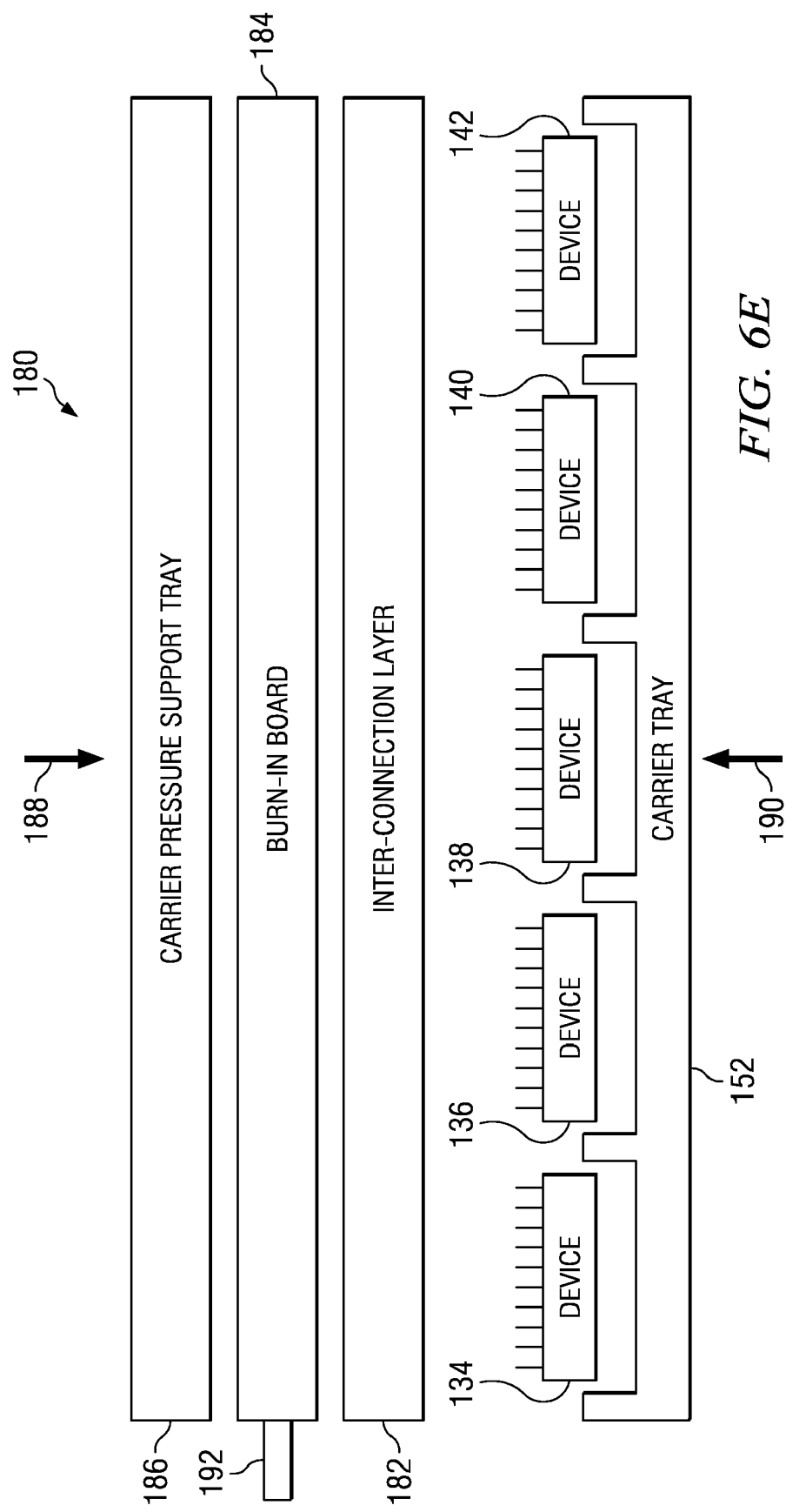
FIG. 6E is a diagram illustrating the final steps of the integrated circuit device transfer and burn-in board coupling method of the present invention.

Finally, FIG. 6E, generally referenced 180, shows inter-connection layer 182 placed on top of the electrical interface contacts of IC devices 134, 136, 138, 140 and 142 resting in carrier tray 152. Burn-in board (a printed circuit board with components) 184 is then placed on top of inter-connection layer 182 and carrier pressure support tray 186 is then placed on top of burn-in board 184. Applying opposing pressure forces 188, 190 to carrier tray 152 and carrier pressure support tray 186 enables the contacts of IC devices 134, 136, 138, 140 and 142 to couple to the appropriate contacts on burn-in board 184 via the electrical conducting material embedded within inter-connection layer 182. Opposing pressure 188, 190 is maintained during the entire burn-in process to maintain the connections. The apparatus represented by FIG. 6E is then inserted into a burn-in oven for testing and coupled to a testing mechanism via contact fingers 192. An implementation of the apparatus represented by FIG. 6E would have screws or latches coupling carrier tray 152 and carrier pressure support tray 186 in order to maintain opposing pressure 188, 190. Implementations of carrier tray 152 can include the capability to maintain a specific temperature using active heaters or to function as a heat sink.

Figure 7A:
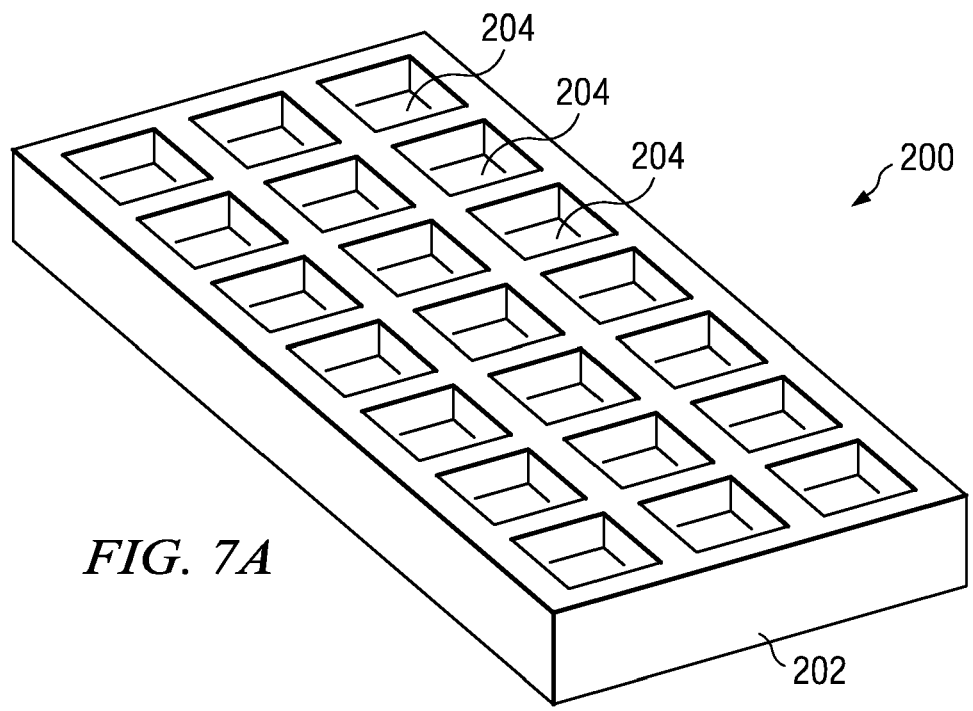
FIG. 7A is an angled view of a first example of a carrier tray utilized by the present invention.

A first sample representation of a carrier tray for BGA packaged integrated circuit devices utilized by the present invention is shown in FIG. 7A. The block diagram, generally referenced 200 comprises carrier tray 202 with twenty one cavities 204 arranged in a seven by three grid. Cavities 204 hold the IC devices with their contacts facing up (i.e. exposed) after the IC devices are transferred from the IC device delivery tray.

Figure 7B:
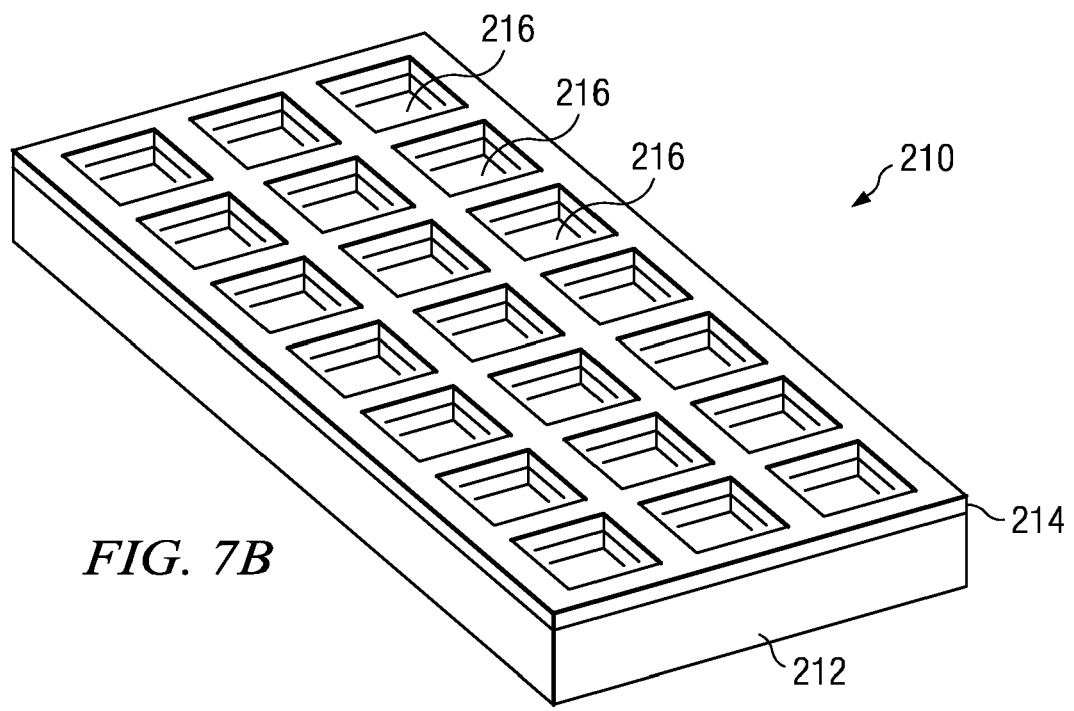
FIG. 7B is an angled view of a second example of a carrier tray utilized by the present invention.

A second sample representation of a carrier tray for QFP packaged integrated circuit devices utilized by the present invention is shown in FIG. 7B. The block diagram, generally referenced 210 comprises carrier tray 212 with twenty one cavities 216 arranged in a seven by three grid. Cavities 216 hold the IC devices with their contacts facing up (i.e. exposed) after the IC devices are transferred from the IC device delivery tray. The top layer of carrier tray 212 is comprised of insulating layer 214. When pressure is applied the carrier tray to couple the IC devices to the BIB, the contacts of the QFP packaged IC devices resting in the carrier tray are pressed by the edges of each cavity. Insulating layer 212 prevents the short-circuiting of the contacts of the QFP packaged IC devices.

Figure 8:
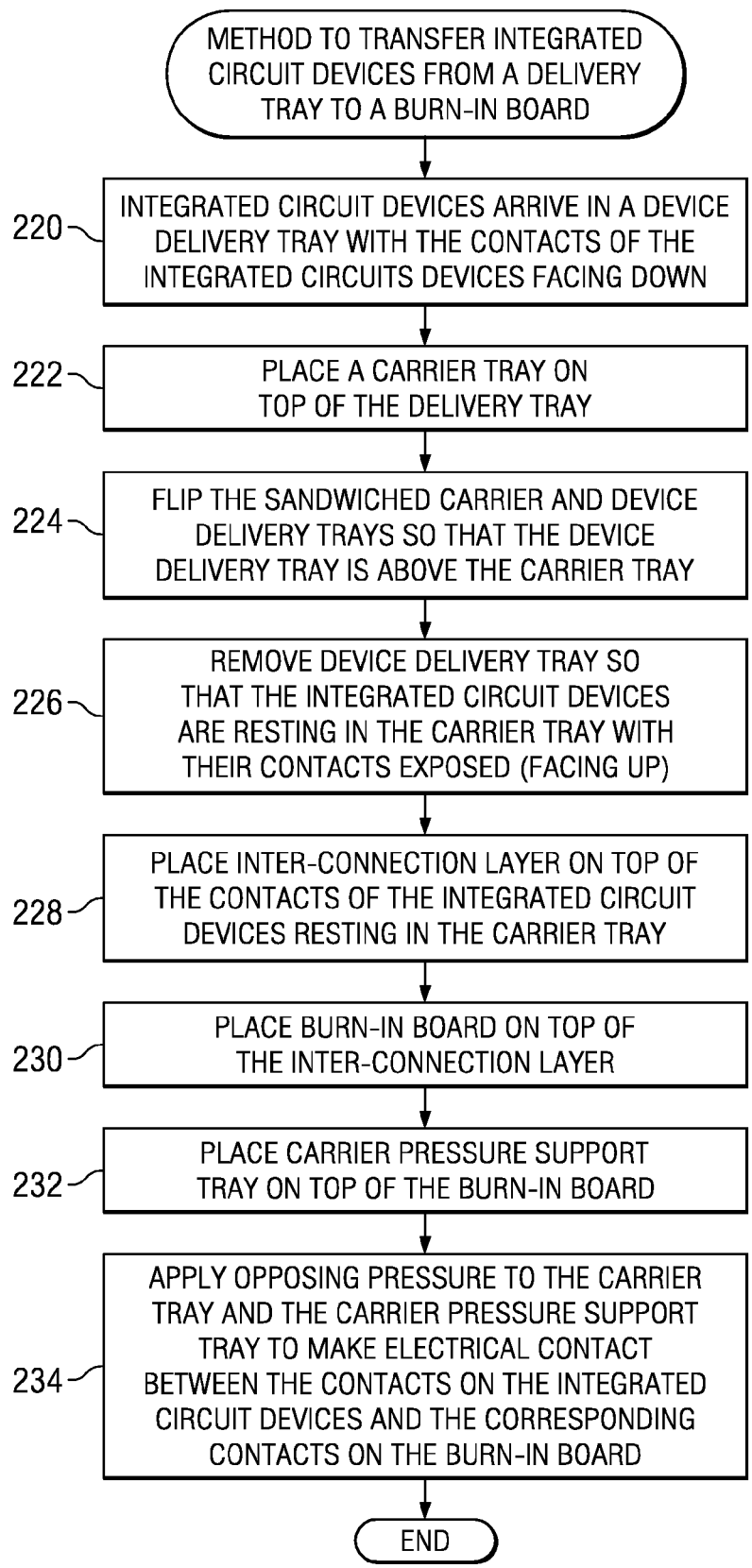
FIG. 8 is a flow diagram illustrating the transferring integrated circuit devices from a delivery tray to a burn-in board method of the present invention.

A flow diagram illustrating the IC device transferring method of the present invention is shown in FIG. 8. A plurality of IC devices arrive in a standard IC device delivery tray with their electrical contacts facing down (step 220). A carrier tray containing the same number of cavities as the IC device delivery tray is placed on top of the IC device delivery tray (step 222). The sandwiched IC device delivery tray and carrier tray are flipped in order that the IC device delivery tray is now on top of the carrier tray (step 224). The IC device delivery tray is now removed, leaving the IC devices resting in the carrier tray cavities with the electrical contacts of the IC devices now facing up (i.e. exposed) (step 226). An inter-connection layer is placed on top of the IC devices now facing up with their electrical contacts exposed (step 228). A burn-in board (i.e. a printed circuit board) is placed on top of the inter-connection layer with its IC device connections facing the inter-connection layer (step 230). A flat carrier pressure support tray is then placed on top of the burn-in board (step 232) and finally, opposing pressure is applied to the carrier tray and the carrier support trays (step 234). The opposing pressure enables the electrical conducting material embedded in the inter-connection layer to couple the contacts of the IC devices (resting in the carrier tray) to the appropriate contacts on the burn-in board.

It is important to note that although the IC device transfer process of the present invention detailed in FIG. 8 is manual, it is more efficient than the prior art method of transferring IC devices from an IC device delivery tray to a burn-in board using an autoloader. The mechanism of the present invention transfers an entire tray of IC devices to a burn-in board in one procedure, with the added efficiency of a one to one ratio of IC devices in the IC device delivery tray to the number of IC devices to be coupled to the burn-in board. Eliminating sockets from burn-in board designs saves money and enables the design of smaller burn-in boards that hold more IC devices than possible in the prior art. Eliminating the need for an autoloader also yields savings in both cost and space utilization. Finally, smaller burn-in boards that hold more IC devices enable the use of smaller burn-in ovens which are less expensive to produce take up less space and use less energy. Despite their smaller size, the smaller burn-in ovens have a greater IC device capacity than those used in the prior art.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of transferring a plurality of integrated circuit (IC) devices having a plurality of contacts from an IC device delivery tray holding a plurality of said IC devices to a printed circuit board, said method comprising the steps of:

placing a carrier tray over said IC device delivery tray;

flipping said carrier tray and said device delivery tray so that said delivery tray is above said carrier tray removing said IC delivery tray so that said plurality of integrated circuit devices are resting in said carrier tray with said contacts facing up;

placing an inter-connection layer over said carrier tray containing said IC devices; placing said printed circuit board on top of said inter-connection layer; and applying opposing pressure to said carrier tray and said printed circuit board, thereby making electrical contact between said plurality of contacts on said IC device and corresponding contacts on said printed circuit board.

2. The method according to claim 1, wherein said contacts of said IC devices in said IC device delivery tray are facing down into a plurality of cavities in said device delivery tray.

3. The method according to claim 2, wherein the number of cavities on said device delivery tray matches the number of cavities on said carrier tray and the number of said IC devices to be coupled to said printed circuit board.

4. The method according to claim 1, wherein said carrier tray holds said IC devices upon said step of removing said IC device delivery tray.

5. The method according to claim 1, wherein said step of removing said IC device delivery tray exposes the contacts of said IC devices.

6. The method according to claim 1, wherein said carrier tray comprises cavities corresponding to the coupling positions for said IC devices on said printed circuit board.

7. The method according to claim 1, wherein said interconnection layer comprises a sheet of insulating material with a plurality of electrically conducting material substantially vertically transposed within said insulating material.

8. A method of transferring a plurality of integrated circuit (IC) devices having a plurality of contacts from an IC device delivery tray holding a plurality of said IC devices to a burn-in board for testing said plurality of IC devices, said method comprising the steps of:

placing a carrier tray over said IC device delivery tray;

flipping said carrier tray and said device delivery tray so that said delivery tray is above said carrier tray removing said IC delivery tray so that said plurality of integrated circuit devices are resting in said carrier tray with said contacts facing up;

placing an inter-connection layer over said carrier tray containing said IC devices; placing said burn-in board on top of said inter-connection layer; and applying opposing pressure to said carrier tray and said burn-in board, thereby making electrical contact between said plurality of contacts on said IC device and corresponding contacts on said burn-in board.

9. The method according to claim 8, wherein said contacts of said IC devices in said device delivery tray are facing down into the cavities of said device delivery tray.

10. The method according to claim 8, wherein the IC device delivery tray and carrier tray each has a plurality of cavities, and the number of cavities on said carrier tray, the number of cavities on said IC device delivery tray and the number of said IC devices to be coupled to said printed circuit board are all equal.

11. The method according to claim 8, wherein said carrier tray holds said IC devices upon said step of removing said IC device delivery tray.

12. The method according to claim 8, wherein said step of removing said IC device delivery tray exposes the contacts of said IC devices.

13. The method according to claim 8, wherein said carrier tray comprises cavities corresponding to the coupling positions for said IC devices on said printed circuit board.

14. The method according to claim 8, wherein said interconnection layer comprises a sheet of insulating material with a plurality of electrically conducting material substantially vertically transposed within said insulating material.

* * * * *